(12) United States Patent
Hayashi et al.

(10) Patent No.: US 10,276,406 B2
(45) Date of Patent: *Apr. 30, 2019

(54) SUBSTRATE PROCESSING DEVICE AND SUBSTRATE PROCESSING METHOD

(71) Applicant: SHIBAURA MECHATRONICS CORPORATION, Yokohama-shi, Kanagawa (JP)

(72) Inventors: Konosuke Hayashi, Yokohama (JP); Masaaki Furuya, Yokohama (JP); Takashi Ootagaki, Yokohama (JP); Yuji Nagashima, Yokohama (JP); Atsushi Kinase, Yokohama (JP); Masahiro Abe, Yokohama (JP)

(73) Assignee: Shibaura Mechatronics Corporation, Yokohama-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/212,899

(22) Filed: Mar. 14, 2014

(65) Prior Publication Data

US 2014/0261566 A1    Sep. 18, 2014

(30) Foreign Application Priority Data

Mar. 18, 2013 (JP) ................. 2013-054559
Feb. 18, 2014 (JP) ................. 2014-028998

(51) Int. Cl.
*B08B 3/10* (2006.01)
*H01L 21/67* (2006.01)

(52) U.S. Cl.
CPC .......... *H01L 21/67028* (2013.01); *B08B 3/10* (2013.01); *H01L 21/67034* (2013.01)

(58) Field of Classification Search
CPC ................. B08B 3/10; H01L 21/67028; H01L 21/67034; H01L 21/6704; H01L 21/67051
See application file for complete search history.

(56) References Cited

U.S. PATENT DOCUMENTS

| | | | |
|---|---|---|---|
| 5,745,946 A * | 5/1998 | Thrasher | H01L 21/67028 134/200 |
| 5,980,637 A | 11/1999 | Singh et al. | |
| 6,033,135 A | 3/2000 | An et al. | |
| 6,173,468 B1 | 1/2001 | Yonemizu et al. | |
| 6,271,149 B1 | 8/2001 | Kondo et al. | |

(Continued)

FOREIGN PATENT DOCUMENTS

| | | |
|---|---|---|
| CN | 102810498 A | 12/2012 |
| JP | 62-92325 A | 4/1987 |

(Continued)

OTHER PUBLICATIONS

Extended European Search Report, dated Sep. 18, 2014, for European Application No. 14160175.7.

(Continued)

*Primary Examiner* — Spencer E Bell
(74) *Attorney, Agent, or Firm* — Birch, Stewart, Kolasch & Birch, LLP

(57) ABSTRACT

A substrate processing device includes a suction drying section drying a surface of a substrate by absorbing and removing a liquid droplet of volatile solvent formed on the surface of the substrate by a heating operation of a heating section.

12 Claims, 8 Drawing Sheets

(56) References Cited

U.S. PATENT DOCUMENTS

| | | | |
|---|---|---|---|
| 6,385,863 B1* | 5/2002 | Kruwinus | H01L 21/67034 |
| | | | 134/31 |
| 6,578,589 B1 | 6/2003 | Mayusumi et al. | |
| 7,000,621 B1 | 2/2006 | Verhaverbeke | |
| 8,097,091 B2 | 1/2012 | Rastegar et al. | |
| 8,907,091 B2 | 12/2014 | Raeppel et al. | |
| 2002/0017315 A1 | 2/2002 | Kamikawa et al. | |
| 2004/0014298 A1* | 1/2004 | Ehrke | H01L 21/67028 |
| | | | 438/455 |
| 2006/0228897 A1 | 10/2006 | Timans | |
| 2006/0231125 A1 | 10/2006 | Yi | |
| 2007/0295365 A1 | 12/2007 | Miya et al. | |
| 2008/0057219 A1* | 3/2008 | Kim | H01L 21/67051 |
| | | | 427/534 |
| 2009/0139977 A1 | 6/2009 | Falter et al. | |
| 2009/0152238 A1* | 6/2009 | Inatomi | G03F 7/40 |
| | | | 216/41 |
| 2011/0155177 A1 | 6/2011 | Tamura et al. | |
| 2012/0132230 A1 | 5/2012 | Toshima et al. | |
| 2012/0160274 A1 | 6/2012 | Kasai et al. | |
| 2012/0260517 A1 | 10/2012 | Lenz et al. | |
| 2012/0304485 A1 | 12/2012 | Hayashi et al. | |
| 2012/0304921 A1 | 12/2012 | Miyamoto et al. | |
| 2013/0025155 A1 | 1/2013 | Kim et al. | |
| 2014/0144464 A1 | 5/2014 | Kaneko et al. | |

FOREIGN PATENT DOCUMENTS

| | | |
|---|---|---|
| JP | 9-148297 A | 6/1997 |
| JP | 11-340187 A | 12/1999 |
| JP | 11-354487 A | 12/1999 |
| JP | 2000-286226 A | 10/2000 |
| JP | 2003-229404 A | 8/2003 |
| JP | 2004-259734 A | 9/2004 |
| JP | 2008-34779 A | 2/2008 |
| JP | 2008-128567 A | 6/2008 |
| JP | 2009-76856 A | 4/2009 |
| JP | 2012-138510 A | 7/2012 |
| KR | 10-2011-0028532 A | 3/2011 |
| KR | 10-2012-0074198 A | 7/2012 |
| TW | 200735164 | 9/2007 |
| TW | 201308476 A1 | 2/2013 |
| TW | 201308499 A1 | 2/2013 |

OTHER PUBLICATIONS

Extended European Search Report dated Oct. 1, 2014 for European Application No. 14160174.0.

Final Office Action of related U.S. Appl. No. 14/212,218, dated Feb. 11, 2016.

Final Office Action of related U.S. Appl. No. 14/212,382, dated Feb. 2, 2016.

Machine translation of JP-2008-128567-A, published on Jun. 5, 2008.

Non-Final Office Action of related U.S. Appl. No. 14/212,218 dated Sep. 10, 2015.

Non-Final Office Action of related U.S. Appl. No. 14/212,382 dated Sep. 10, 2015.

English Machine Translation of JP-9-148297-A, published on Jun. 6, 1997.

Non-Final Office Action of related U.S. Appl. No. 14/212,218 dated Aug. 2, 2016.

Japanese Notification of Reasons for Refusal for Japanese Application No. 2014-031405, dated Mar. 5, 2018, with an English translation.

* cited by examiner

SUBSTRATE PROCESSING DEVICE AND SUBSTRATE PROCESSING METHOD

The disclosure of Japanese Patent Application No. 2013-054559 filed Mar. 18, 2013 and Japanese Patent Application No. 2014-028998 filed Feb. 18, 2014 including specifications, drawings and claims is incorporated herein by reference in its entirety, claiming the benefit of their priorities.

FIELD OF THE INVENTION

The present intention relates to a substrate processing device and a substrate processing method.

RELATED ART

In manufacturing semiconductors and others, a substrate processing device supplies a processing liquid to a surface of a substrate of a wafer, a liquid crystal substrate or the like to process a surface of the substrate, then supplies a cleaning liquid such as ultrapure water to the substrate surface to clean the substrate surface, and further dries it. In the drying, there are problems that occur with patterns, e.g., around memory cells and gates collapses due to miniaturization according to increase in integration degree and capacity of the semiconductors in recent years. This is due to spacing between patterns, structures of them, a surface tension of the cleaning liquid and others.

Accordingly, for the purpose of suppressing the pattern collapsing, such a substrate drying method has been proposed (e.g., see Japanese Patent Application Publication No. 2008-34779 (Patent Literature 1)) that uses IPA (2-Propanol: Isopropyl Alcohol) having a smaller surface tension than the ultrapure water, and mass production factories and others have employed a method of drying the substrate by replacing the ultrapure water on the substrate surface with the IPA.
[Patent Literature 1] Japanese Patent Application Publication No. 2008-34779

SUMMARY OF THE INVENTION

Problems to be Solved by the Invention

However, the semiconductors have been increasingly miniaturized, and even the drying that uses a liquid such as organic solvent (e.g., IPA) or the like of a small surface tension may collapse fine patterns of wafers due to the surface tension and the like of the liquid.

For example, during a liquid drying process, unequal speeds of drying are caused in various portions of a surface of a substrate W and, as illustrated in FIG. 8B, when a liquid A1 remains between some patterns P, a pattern collapse is caused by the surface tension of the liquid A1 between them. In particular, the patterns located in the portion where the liquid remains are mutually pulled by the surface tension of the liquid, and elastically deform to collapse, and a slight amount of residues dissolved into the liquid condenses. When the liquid is completely dried thereafter, the collapsed patterns are fixedly adhered together due to interposition or the like of the residues.

An object of the invention is to provide a substrate processing device and a substrate processing method that can instantaneously dry a liquid on a surface during drying of a substrate.

Means for Solving the Problems

A substrate processing device according to the invention has a cleaning liquid supplying section supplying a cleaning liquid to a surface of a substrate, a solvent supplying section supplying a volatile solvent to the surface of the substrate supplied with the cleaning liquid to replace the cleaning liquid on the surface of the substrate with the volatile solvent, and a heating section heating the substrate supplied with the volatile solvent, and further has a suction drying section drying the surface of the substrate by absorbing and removing a liquid droplet of the volatile solvent formed on the surface of the substrate by a heating operation of the heating section.

A substrate processing method according to the invention includes supplying a cleaning liquid to a surface of a substrate, supplying a volatile solvent to the surface of the substrate supplied with the cleaning liquid to replace the cleaning liquid on the surface of the substrate with the volatile solvent, and heating the substrate supplied with the volatile solvent, and further includes drying the surface of the substrate by absorbing and removing a liquid droplet of the volatile solvent formed on the surface of the substrate by heating of the substrate.

Effect of the Invention

The substrate processing device and the substrate processing method of the invention can instantaneously dry the liquid on the surface of the substrate at the time of drying the substrate.

DETAILED DESCRIPTION (Embodiment 1) (FIGS. 1-4)

Figure 1:
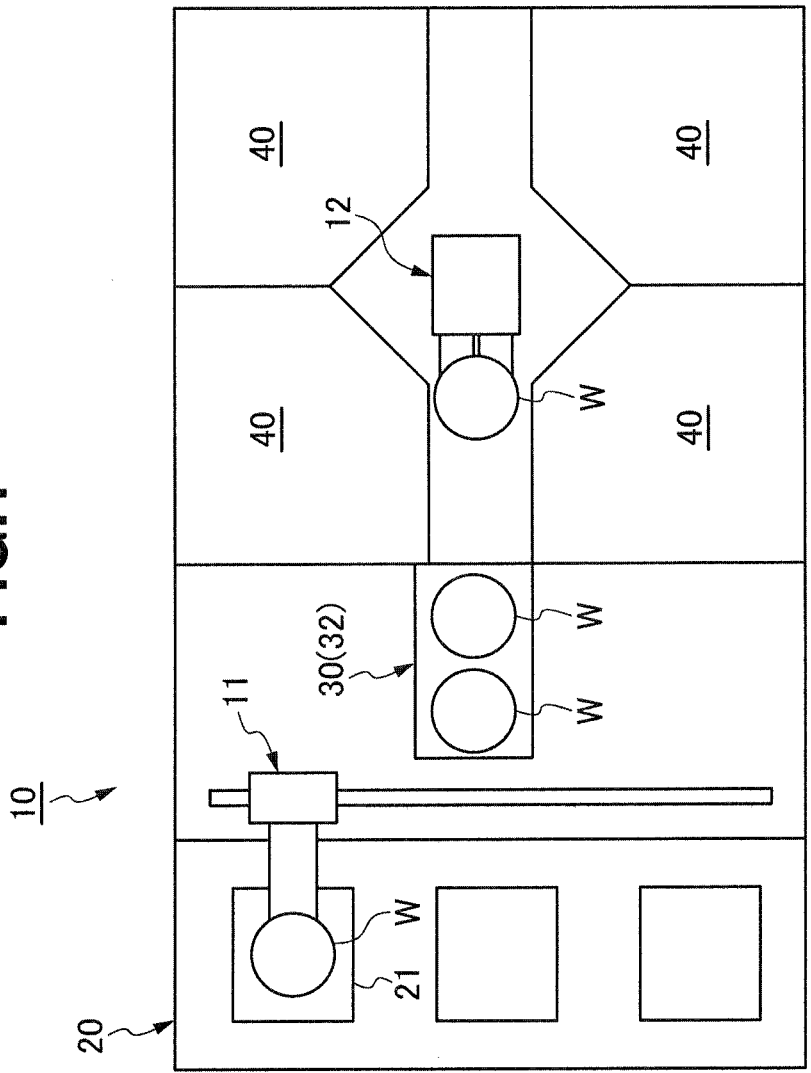
FIG. 1 is a schematic view illustrating a substrate processing device of an embodiment 1.

As illustrated in FIG. 1, a substrate processing device 10 of an embodiment 1 has a substrate supply/discharge section 20, a substrate storing buffer section 30, a plurality of substrate cleaning chambers 40, and a substrate drying chamber 60 arranged in an out-dedicated buffer 32 which is employed in the substrate storing buffer section 30 and will be described later. A transporting robot 11 is arranged between the substrate supply/discharge section 20 and the substrate storing buffer section 30, and a transporting robot 12 is arranged between the substrate storing buffer section 30 and the substrate cleaning chamber 40.

A plurality of substrate accommodation cassettes 21 can be supplied to and discharged from the substrate supply/discharge section 20. The substrate accommodation cassette 21 which has accommodated a plurality of substrates W such as unprocessed wafers, liquid crystal substrates or the like is supplied to the substrate supply/discharge section 20, and will be discharged from the substrate supply/discharge section 20 together with the accommodated substrates W which are processed in the substrate cleaning chamber 40 and the substrate drying chamber 60. The unprocessed substrates W are successively taken out by the transporting robot 11 from multi-level accommodation shelves of the substrate accommodation cassette 21 in the substrate supply/discharge section 20, are supplied to an in-dedicated buffer 31 (not illustrated) to be described later in the substrate storing buffer section 30, further are taken out by the transporting robot 12 from the in-dedicated buffer 31 of the substrate storing buffer section 30, and are supplied to the substrate cleaning chamber 40 for cleaning. The transporting robot 12 takes out the substrate W cleaned in the substrate cleaning chamber 40 from the substrate cleaning chamber 40, and feeds it to the out-dedicated buffer 32 to be described later of the substrate storing buffer section 30. Then, the transporting robot 11 takes the substrates W after being dried in the substrate drying chamber 60 in the out-dedicated buffer 32 of the substrate storing buffer section 30, and successively discharges the substrates W to the empty accommodation shelves in the substrate accommodation cassette 21 of the substrate supply/discharge section 20. The substrate accommodation cassette 21 filled with the processed substrates W is transported from the substrate supply/discharge section 20.

The substrate storing buffer section 30 has the plurality of in-dedicated buffers 31 arranged in the multi-shelf form for storing the unprocessed substrates W, and has the plurality of out-dedicated buffers 32 arranged in the multi-shelf form for storing the substrates W cleaned in the substrate cleaning chamber 40. The substrate drying chamber 60 is arranged in the out-dedicated buffer 32 as will be described later. The in-dedicated buffer 31 and the out-dedicated buffer 32 may not have the multi-shelf form.

Figure 2:
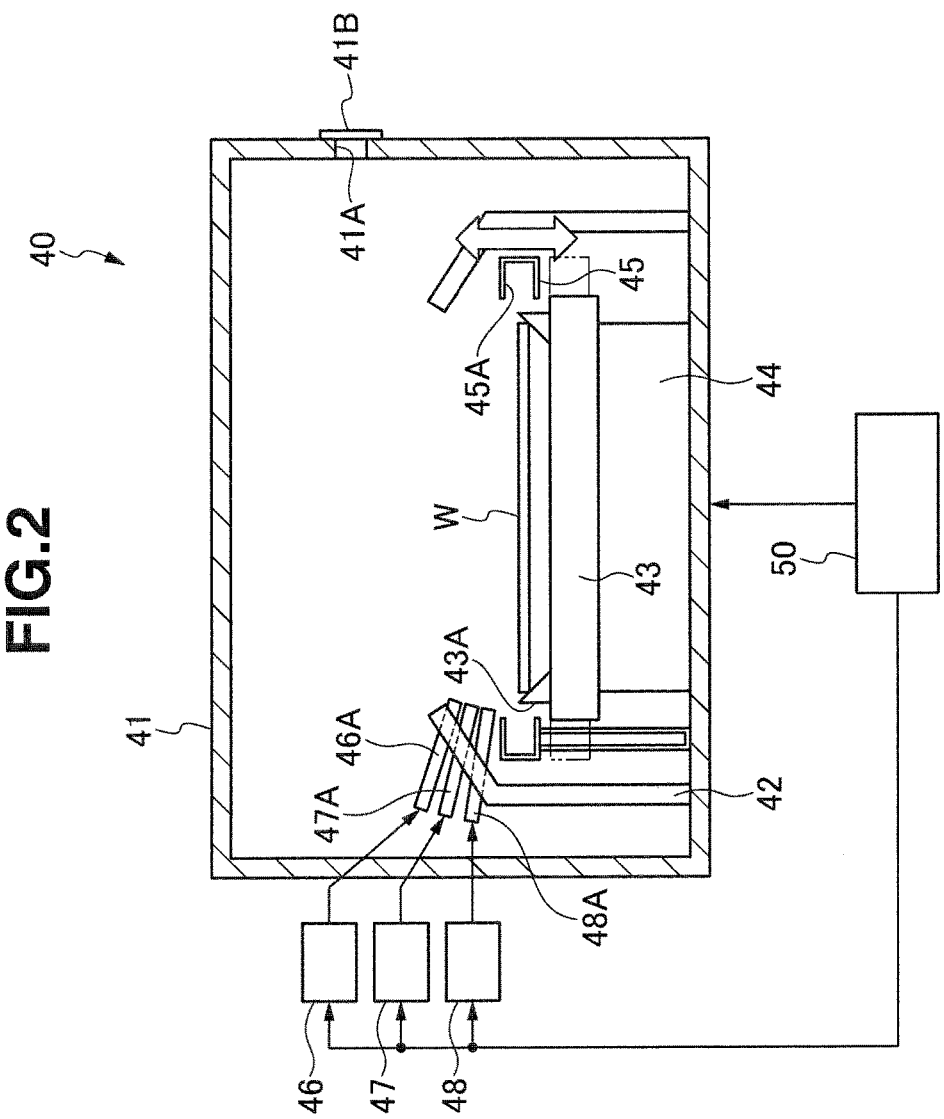
FIG. 2 is a schematic view illustrating a structure of a substrate cleaning chamber of the substrate processing device.

The substrate cleaning chamber 40 includes, as illustrated in FIG. 2, a processing box 41 forming a processing chamber, a cup 42 arranged in the processing box 41, a table 43 carrying the substrate W in a horizontal position in the cup 42, a rotation section 44 rotating the table 43 in a horizontal plane, and a solvent suction discharging section 45 that can vertically move around the table 43. The substrate cleaning chamber 40 further includes a chemical solution supply section 46 supplying a chemical solution to a surface of the substrate W on the table 43, a cleaning liquid supply section 47 supplying a cleaning liquid to the surface of the substrate W on the table 43, a solvent supply section 48 supplying a volatile solvent, and a controller 50 controlling the various sections.

The processing box 41 has a substrate inlet/outlet opening 41A opening at a portion of its peripheral wall. A shutter 41B can close and open the substrate inlet/outlet opening 41A.

The cup 42 has a cylindrical form, surrounds the periphery of the table 43, and accommodates it. The cup 42 has a peripheral wall having an upper portion tapered to converge upward, and has an opening to expose the substrate W on the table 43 upward. This cup 42 receives the chemical solution and cleaning liquid that flow or disperse from the rotating substrate W. The cup 42 is provided at its bottom with a discharge pipe (not illustrated) for discharging the received chemical solution and cleaning liquid.

The table 43 is positioned near a center of the cup 42, and is rotatable in the horizontal plane. The table 43 has a plurality of support members 43A such as pins, which removably hold the substrate W such as a wafer or a liquid crystal substrate.

The rotation section 44 has a rotation axis coupled to the table 43, a motor serving as a drive source for rotating the rotation shaft, and others (not illustrated), and rotates the table 43 by the driving of the motor through the rotation shaft. The rotation section 44 is electrically connected to the controller 50, which controls the drive of the rotation section 44.

The solvent suction discharging section 45 includes a solvent absorbing port 45A having an annular opening surrounding the periphery of the table 43. The solvent suction discharging section 45 has an elevator section (not illustrated) for vertically moving the solvent absorbing port 45A, and vertically moves the solvent absorbing port 45A between a standby position where the solvent absorbing port 45A is positioned lower than the table surface of the table 43 and an operation position where the solvent absorbing port 45A is positioned around the substrate W held by the table 43. The solvent absorbing port 45A absorbs and receives the volatile solvent dispersed from the rotating substrate W. The solvent absorbing port 45A is connected to an exhaust fan or a vacuum pump (not illustrated) for absorbing the volatile solvent as well as an exhaust pipe (not illustrated) for discharging the volatile solvent that is absorbed and received.

The chemical solution supply section 46 has a nozzle 46A discharging the chemical solution obliquely to the surface of the substrate W on the table 43, and supplies the chemical solution such as APM (Ammonia and hydrogen Peroxide Mixture) for resist peeling processing to the surface of the substrate W on the table 43 through the nozzle 46A. The nozzle 46A is attached to an upper portion of the peripheral wall of the cup 42, and its angle, discharging flow velocity and others are adjusted to supply the chemical solution to the vicinity of the surface center of the substrate W. The chemical solution supply section 46 is electrically connected to the controller 50, which controls the drive of the chemical solution supply section 46. The chemical solution supply section 46 includes a tank storing the chemical solution, a pump serving as a drive source, a valve serving as a regulator valve regulating a supply rate, and others, although not illustrated.

The cleaning liquid supply section 47 has a nozzle 47A discharging the cleaning liquid obliquely to the surface of the substrate W on the table 43, and supplies the cleaning liquid such as pure water (ultrapure water) for cleaning processing to the surface of the substrate W on the table 43 through the nozzle 47A. The nozzle 47A is attached to the upper portion of the peripheral wall of the cup 42, and its angle, discharging flow velocity and others are adjusted to supply the chemical solution to the vicinity of the surface center of the substrate W. The cleaning liquid supply section 47 is electrically connected to the controller 50, which controls the drive of the cleaning liquid supply section 47. The cleaning liquid supply section 47 includes a tank storing the cleaning liquid, a pump serving as a drive source, and a valve serving as a regulator valve regulating a supply rate, although not illustrated.

The solvent supply section 48 has a nozzle 48A discharging the volatile solvent obliquely to the surface of the substrate W on the table 43, and supplies the volatile solvent such as IPA to the surface of the substrate W on the table 43 through the nozzle 48A. The solvent supply section 48 supplies the volatile solvent to the surface of the substrate W cleaned with the cleaning liquid supplied by the cleaning liquid supply section 47, and replaces the cleaning liquid on the surface of the substrate W with the volatile solvent. The nozzle 48A is attached to the upper portion of the peripheral wall of the cup 42, and its angle, discharging flow velocity and others are adjusted to supply the volatile solvent to the vicinity of the surface center of the substrate W. The solvent supply section 48 is electrically connected to the controller 50, which controls the drive of the solvent supply section 48. The solvent supply section 48 includes a tank storing the volatile solvent, a pump serving as a drive source, and a valve serving as a regulator valve regulating a supply rate, although not illustrated.

In addition to the IPA, univalent alcohols such as ethanol, and ethers such as diethyl ether and ethyl methyl ether as well as ethylene carbonate and the like may be used as the volatile solvent. The volatile solvent is preferably water-soluble.

The controller 50 includes a microcomputer that centrally controls the various portions, and a storage storing substrate processing information relating to the substrate processing, various kinds of programs and others. The controller 50 controls, based on the substrate processing information and various programs, the rotation section 44, solvent suction discharging section 45, chemical solution supply section 46, cleaning liquid supply section 47, solvent supply section 48 and others, and controls the supplying of the chemical solution by the chemical solution supply section 46, supplying of the cleaning liquid by the cleaning liquid supply section 47, supplying of the volatile solvent by the solvent supply section 48 performed on the surface of the substrate W on the rotating table 43, and others.

Figure 3:
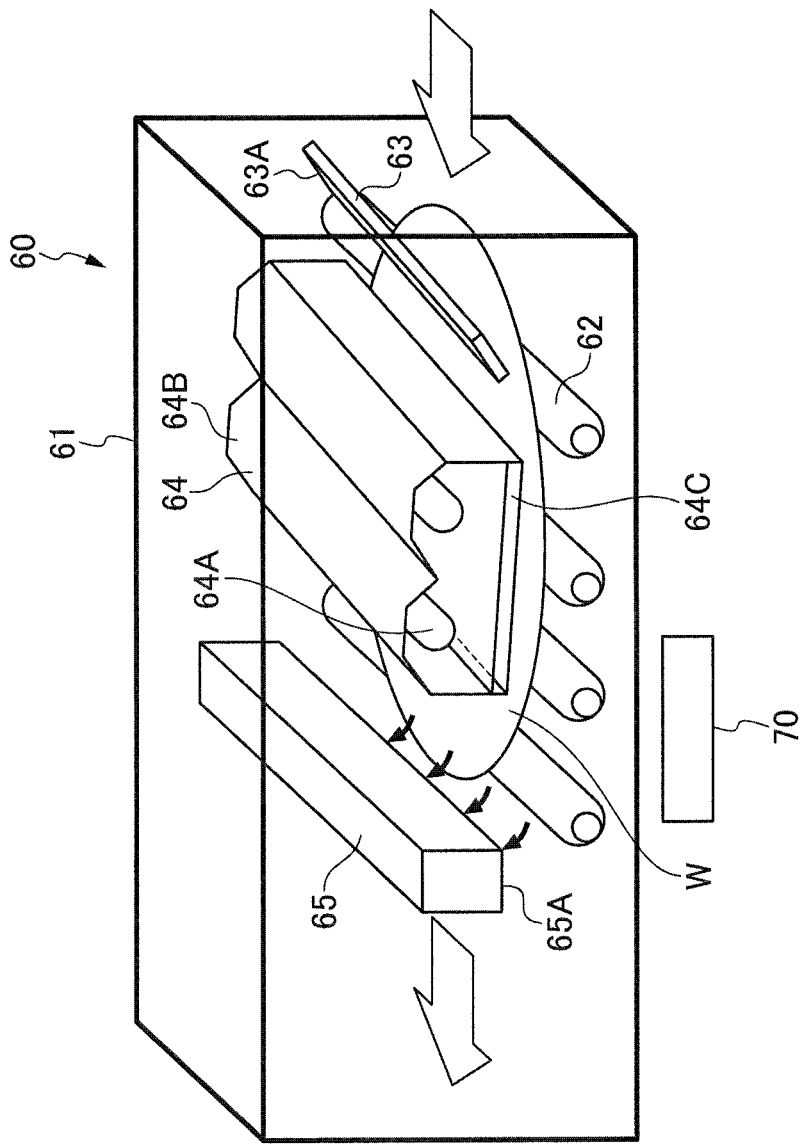
FIG. 3 is a schematic view illustrating a structure of a substrate drying chamber of the substrate processing device.

The substrate drying chamber 60 is arranged for each of the multi-level shelves in the out-dedicated buffer 32 of the substrate storing buffer section 30, and includes, as illustrated in FIG. 3, a tunnel-like processing box 61 forming a processing chamber, and a plurality of transport rollers 62 forming a transporting section in the processing box 61. Further, the substrate drying chamber 60 includes a gas supply section 63 supplying a gas to the surface of the substrate W on the transport rollers 62, a heating section 64 for heating the substrate W to which the volatile solvent is supplied in the substrate cleaning chamber 40, a suction drying section 65 for drying the surface of the substrate W heated by the heating section 64, and a controller 70 controlling various portions. Although the transport rollers 62 are likewise arranged downstream to the position where the suction drying section 65 is arranged, these are not illustrated in FIG. 3.

The processing box 61 has a tunnel-like form. The substrate W which is subjected to the cleaning processing and is taken out from the substrate cleaning chamber 40 by the transporting robot 12 is fed through an upstream opening of the processing box 61, and the substrate W which is subjected to the drying processing by the substrate drying chamber 60 is discharged by the transporting robot 11 through a downstream opening of the processing box 61.

The transport rollers 62 are driven to rotate by a drive section such as a motor (not illustrated), and transport the substrate W fed through the upstream opening of the processing box 61 through a lower transport passage of the gas supply section 63, heating section 64, and suction drying section 65 toward the downstream opening. The transport rollers 62 are electrically connected to the controller 70, which controls the drive of the transport rollers 62.

The gas supply section 63 is located upstream, in the substrate transporting direction of the transport rollers 62, to the heating section 64, and is arranged above the transport rollers 62. The gas supply section 63 has a slit-like nozzle 63A obliquely discharging a gas to the widthwise full area of the surface of the substrate W on the transport rollers 62, and supplies through the nozzle 63A a gas such as nitrogen gas to the surface of the substrate W on the transport rollers 62 to form a nitrogen gas atmosphere in the space on the surface of the substrate W in the processing box 61. The nozzle 63A is attached to the processing box 61, and its angle, discharging flow velocity and others are adjusted to supply the gas to the widthwise full area of the surface of the substrate W. This gas supply section 63 is electrically connected to the controller 70, which controls the drive of the gas supply section 63. The gas supply section 63 includes a tank storing the gas, a valve serving as a regulator valve regulating a supply rate, and others, although not illustrated. The supply rate of the gas is adjusted such that the gas discharged from the nozzle 63A may not completely dry the volatile solvent already supplied to the surface of the substrate W.

As the supplied gas, an inert gas such as argon gas, carbon dioxide gas or helium gas other than nitrogen gas can be used. Since the insert gas is supplied to the surface of the substrate W, the oxygen on the surface of the substrate W can be removed, and production of watermarks can be prevented.

The heating section 64 has a plurality of lamps 64A, and is arranged above the transport rollers 62. When each lamp 64A is turned on, it irradiates the surface of the substrate W on the transport rollers 62 with light. The heating section 64 heats the substrate W by irradiating the widthwise full area of the surface of the substrate W with the light emitted through a transparent cover 64C from the lamps 64A arranged in a lamp casing 64B attached to the processing box 61. This heating section 64 is electrically connected to the controller 70, which controls the drive of the heating section 64.

The heating section 64 may be formed of the plurality of lamps 64A, e.g., of a straight-tube type arranged in parallel, or the plurality of lamps 64A of a light ball type arranged in an array fashion. The lamp 64A may be, for example, a halogen lamp, xenon flash lamp or the like.

Figure 8A:
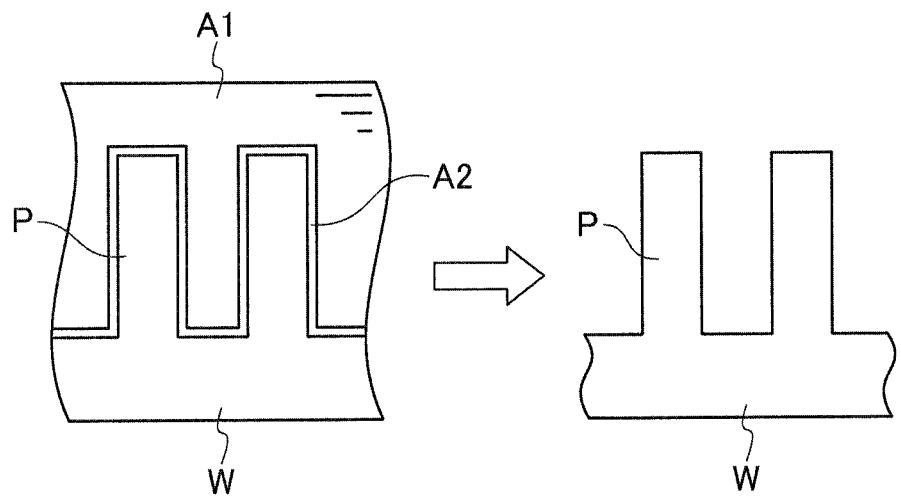
FIGS. 8A and 8B are schematic views illustrating a state of drying of a volatile solvent on a substrate surface.
Figure 8B:
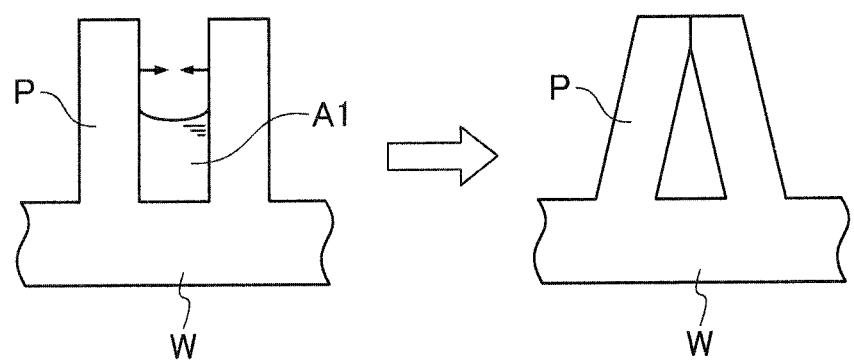

In heating of the substrate W using the heating section 64, as illustrated in FIG. 8A, the heating by the heating section 64 causes liquid A1 of the volatile solvent in contact with a pattern P on the surface of the substrate W to start evaporation earlier than the liquid A1 of the volatile solvent on the other portion. More specifically, in the liquid A1 of the volatile solvent supplied to the surface of the substrate W, only the liquid in contact with the surface of the substrate W is rapidly heated to attain the gas phase. Thereby, gasification (boiling) of the liquid A1 of the volatile solvent forms a gas layer, namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

The suction drying section 65 is located downstream, in the substrate transporting direction of the transport rollers 62, from the heating section 64 and is arranged above the transport rollers 62. The suction drying section 65 is attached to the processing box 61, and has a solvent suction port 65A of a slit-like form opening toward the widthwise full area of the surface of the substrate W on the transport rollers 62. The suction drying section 65 applies a suction force provided to the solvent suction port 65A to the widthwise full area of the surface of the substrate W, and dries the surface of the substrate W by absorbing and removing the droplets of the volatile solvent produced on the surface of the substrate W by the heating operation of the heating section 64 as described above. This suction drying section 65 is electrically connected to the controller 70, which controls the drive of the suction drying section 65. A vacuum pump (not illustrated) for absorbing the droplets of the volatile solvent is connected to the solvent suction port 65A.

In the substrate drying chamber 60, a blow-off drying section may be used together with the suction drying section 65. This blow-off drying section blows and removes the droplets of the volatile solvent produced on the surface of the substrate W by an injected gas to dry the surface of the substrate W. The gas supply section 63 described above may also be used as this blow-off drying section.

Figure 4:
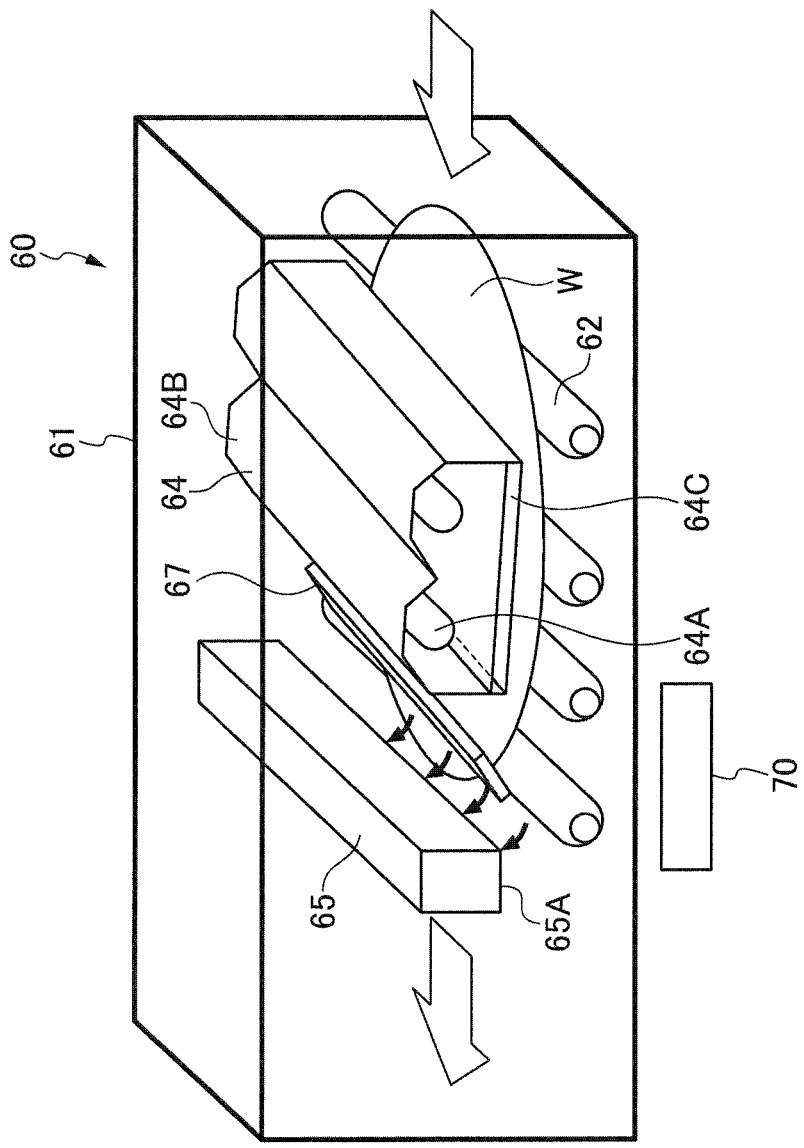
FIG. 4 is a schematic view illustrating a modification of a substrate cleaning chamber of the substrate processing device.

FIG. 4 illustrates a modification of the substrate drying chamber 60. This modification is provided with a blow-off drying section 67 injecting an inert gas such as nitrogen gas to a downstream side of the heating section 64 in the substrate transporting direction of the transport rollers 62 when an atmosphere forming section (not illustrated) controls the space on the surface of the substrate W in the processing box 61 to keep a nitrogen gas atmosphere, and is configured to blow and remove the droplets of the volatile solvent produced on the surface of the substrate W by the blow-off drying section 67.

The controller 70 includes a microcomputer centrally controlling various portions, and a storage storing the substrate processing information and various programs relating to the substrate processing. The controller 70 controls the gas supply section 63, heating section 64, suction drying section 65 and others based on the substrate processing information and the various programs, and further controls the gas supply section 63, heating by the heating section 64, suction force of the suction drying section 65, and others effected on the surface of the substrate W on the transport rollers 62.

Procedures of cleaning and drying the substrate W by the substrate processing device 10 will now be described below.

(1) The transporting robot 11 supplies the substrate W from the substrate accommodation cassette 21 of the substrate supply/discharge section 20 to the in-dedicated buffer 31 of the substrate storing buffer section 30, and the transporting robot 12 takes out and sets the supplied substrate W on the table 43 of the substrate cleaning chamber 40. In this state, the controller 50 of the substrate cleaning chamber 40 controls the rotation section 44 to rotate the table 43 at a predetermined rotation speed, and then controls the chemical solution supply section 46 while positioning the solvent suction discharging section 45 in the standby position so that the chemical solution, i.e., APM is supplied from the nozzle 46A to the surface of the substrate W on the rotating table 43 for a predetermined time. The chemical solution, i.e., APM is discharged from the nozzle 46A toward the center of the substrate W on the rotating table 43, and the centrifugal force caused by the rotation of the substrate W spreads it over the whole surface of the substrate W. Thereby, the APM covers and processes the surface of the substrate W on the table 43.

The controller 50 continuously rotates the table 43 for a period from the above (1) to (3) to be described later. In this operation, the processing conditions such as a rotation speed of the table 43, a predetermined time and the like are set in advance, but an operator can arbitrarily change them.

(2) After stopping the supply of the chemical solution, the controller 50 then controls the cleaning liquid supply section 47 to supply the cleaning liquid, i.e., ultrapure water from the nozzle 47A to the surface of the substrate W on the rotating table 43 for a predetermined time. The cleaning liquid, i.e., ultrapure water is discharged from the nozzle 47A toward the center of the substrate W on the rotating table 43, and is spread over the whole surface of the substrate W by the centrifugal force caused by rotation of the substrate W. Thereby, the surface of the substrate W on the table 43 is covered and cleaned by the ultrapure water.

(3) When the cleaning liquid supply section 47 ends the cleaning of the substrate W, the controller 50 then locates the solvent suction discharging section 45 in the operation position, and controls the solvent supply section 48 to supply the volatile solvent, i.e., IPA from the nozzle 48A to the surface of the substrate W on the rotating table 43 for a predetermined time. It is preferable that IPA be supplied before the ultrapure water above (2) is dried. The volatile solvent, i.e., IPA is discharged from the nozzle 48A toward the center of the substrate W on the rotating table 43, and is spread over the whole surface of the substrate W by the centrifugal force caused by rotation of the substrate W. At this time, the solvent suction discharging section 45 absorbs the IPA dispersing from the rotating substrate W. Thereby, the ultrapure water on the surface of the substrate W on the table 43 is replaced with the IPA. The rotation speed of the substrate W, i.e., the table 43 in the above operation is substantially set to form a thin film of the volatile solvent over the surface of the substrate W to an extent that the surface of the substrate W is not exposed by forming.

The IPA discharged from the nozzle 48A of the solvent supply section 48 is set to a temperature below a boiling point so that the IPA may be reliably in the liquid state when it is supplied to the surface of the substrate W, and thereby the ultrapure water may be reliably and uniformly replaced with the IPA on the whole surface of the substrate W.

(4) Then, the controller 50 stops rotation of the table 43 of the substrate cleaning chamber 40, and the transporting robot 12 takes out the substrate W on the rotation-stopped table 43 from the substrate cleaning chamber 40, and feeds the substrate W onto the transport rollers 62 through the upstream opening of the processing box 61 in the substrate drying chamber 60 arranged in the out-dedicated buffer 32 of the substrate storing buffer section 30. The controller 70 of the substrate drying chamber 60 controls the gas supply section 63 to supply the gas, i.e., nitrogen gas from the nozzle 63A to the surface of the substrate W on the transport rollers 62 for a predetermined time. The nozzle 63A discharges the nitrogen gas toward the widthwise full area of the substrate W on the transport rollers 62. Thereby, the nitrogen atmosphere is formed in the space containing the substrate W on the transport rollers 62. By keeping the nitrogen atmosphere in this space, the oxygen concentration is reduced to suppress generation of watermarks on the surface of the substrate W.

(5) Then, the controller 70 controls the heating section 64 to turn on each lamp 64A of the heating section 64 to heat the substrate W on the transport rollers 62 for a predetermined time. At this time, the heating section 64 can perform the heating that can raise the temperature of the substrate W to 100 degrees or above in 10 seconds. This can instantaneously vaporize the liquid A1 of the volatile solvent in contact with the pattern P on the surface of the substrate W, and can immediately form the droplets of the liquid A1 of the volatile solvent on the other portion of the surface of the substrate W.

In the above heat drying by the heating section 64, it is important to heat the substrate W to a high temperature of hundreds of degrees within several seconds for instantaneously evaporating the volatile solvent, i.e., IPA in contact with the pattern P of the substrate W. It is necessary to heat only the substrate W without heating the IPA. For this, it is desirable to use the lamp 64A having a peak intensity in wavelengths of 500-3000 nm. For reliable drying that can reduce a pattern collapse rate, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially within 10 seconds and, for example, falls within a range from several tens of milliseconds to several seconds.

(6) Then, the controller 70 controls the suction drying section 65 to absorb and remove the droplets of the IPA which were produced on the surface of the substrate W by the heating operation of the heating section 64 on the transport rollers 62, and thereby dries the surface of the substrate W.

(7) Then, the transporting robot 11 takes out the substrate W which is already washed and dried on the transport rollers 62 through the downstream opening of the processing box 61 in the substrate drying chamber 60 arranged in the out-dedicated buffer 32 of the substrate storing buffer section 30, and discharges the substrate W to the substrate accommodation cassette 21 of the substrate supply/discharge section 20.

The embodiment achieves the following operation and effect.

(a) The operation of heating the substrate W by the heating section 64 vaporizes the liquid of the volatile solvent, i.e., IPA used for replacement around the pattern P on the surface of the substrate W so that a gas layer of the vapored IPA forms a thin film around the pattern P on the surface of the substrate W. The liquid of IPA between the neighboring patterns P of the substrate W is pushed out by the gas layer, and is changed into a large number of droplets by its own surface tension. The suction drying section 65 immediately absorbs the droplets of IPA formed on the surface of the substrate W in this manner and removes them from the surface of the substrate W. Accordingly, the liquid of IPA is dried instantaneously on the whole surface of the substrate W, and the drying speeds of various portions of the surface of the substrate W can be uniform so that no IPA remaining between certain patterns P occurs, and it is possible to suppress collapsing of the patterns P due to the surface tension of the liquid of the remaining IPA.

(b) The suction drying section 65 can reliably and easily absorb and remove the volatile solvent, i.e., IPA to a particular dedicated discharging destination. Accordingly, contact or the like of the volatile solvent with other chemical solution in a discharged place can be avoided, and unexpected firing and others of the volatile solvent can be prevented.

(c) By using the blow-off drying section (the gas supply section 63 or the blow-off drying section 67) in addition to the suction drying section 65 in the foregoing (a), the droplets of the volatile solvent produced on the surface of the substrate W can be removed by blowing off them. The liquid of the volatile solvent on the surface of the substrate W can be dried further instantaneously so that the drying speeds of the various portions of the substrate surface can be further uniformized to suppress more reliably the collapsing of the pattern P on the substrate surface.

Figure 5:
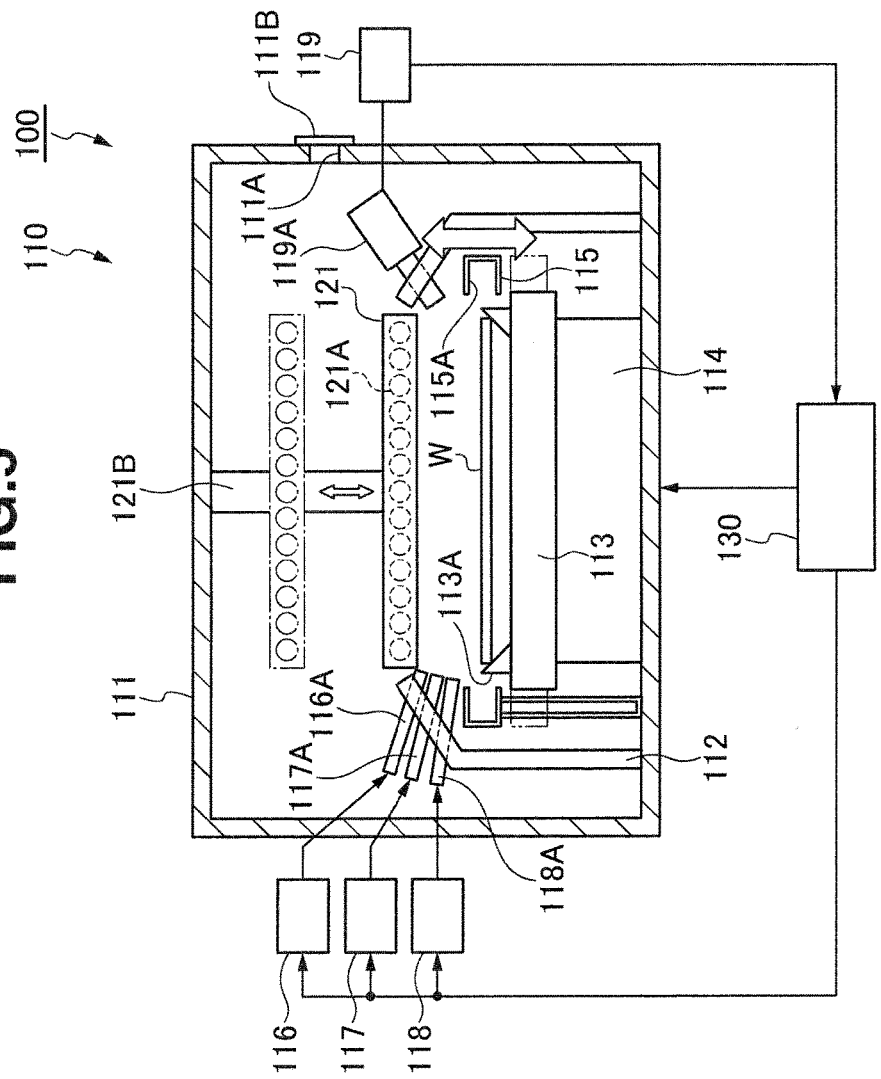
FIG. 5 is a schematic view illustrating a substrate processing device of an embodiment 2.

(Embodiment 2) (FIG. 5)

In a substrate processing device 100 of an Embodiment 2, the substrate cleaning chamber 40 in the substrate processing device 10 of Embodiment 1 is replaced with a substrate processing chamber 110, the substrate drying chamber 60 is removed from the out-dedicated buffer 32 of the substrate storing buffer section 30 in Embodiment 1, and the substrate processing chamber 110 intensively has the functions of the substrate cleaning chamber 40 and the substrate drying chamber 60 in Embodiment 1. The substrate processing chamber 110 will now be described.

The substrate processing chamber 110 includes, as illustrated in FIG. 5, a processing box 111 forming a processing chamber, a cup 112 arranged in the processing box 111, a table 113 supporting a substrate W horizontal in the cup 112, a rotation section 114 rotating the table 113 in a horizontal plane, and a solvent suction discharging section 115 which moves vertically in an area around the table 113. The substrate processing chamber 110 has a chemical solution supply section 116 supplying a chemical solution to a surface of the substrate W on the table 113, a cleaning liquid supply section 117 supplying a cleaning liquid to the surface of the substrate W on the table 113, a solvent supply section 118 supplying a volatile solvent, a gas supply section 119 for supplying a gas, a heating section 121 heating the substrate W supplied with the volatile solvent, and a controller 130 controlling various portions.

In the substrate processing chamber 110, specific structures of the processing box 111, cup 112, table 113, rotation section 114, solvent suction discharging section 115, chemical solution supply section 116, cleaning liquid supply section 117, and solvent supply section 118 are substantially the same as those of the processing box 41, cup 42, table 43, rotation section 44, solvent suction discharging section 45, chemical solution supply section 46, cleaning liquid supply section 47, and solvent supply section 48 in the substrate cleaning chamber 40 of Embodiment 1, respectively.

In the substrate processing chamber 110, however, the solvent suction discharging section 115 not only absorbs and receives the volatile solvent dispersed from a rotating substrate W, but also has a function of absorbing and removing the droplets of the volatile solvent produced on the surface of the substrate W by the heating operation of the heating section 121, which is not employed in the solvent suction discharging section 45. Accordingly, the solvent suction discharging section 115 has a suction power that can absorb the droplets of the volatile solvent such as droplets of the IPA present on the surface of the substrate W.

The gas supply section 119 has a nozzle 119A discharging a gas obliquely to the surface of the substrate W on the table 113, and supplies an inert gas, e.g., nitrogen gas to the surface of the substrate W on the table 113 through the nozzle 119A so that a nitrogen gas atmosphere is formed in the space above the surface of the substrate W in the processing box 111. The specific structure of the gas supply section 119 is substantially the same as that of the gas supply section 63 arranged in the substrate drying chamber 60 of Embodiment 1. The nozzle 119A may not have a slit-like form, and may be a circular nozzle.

The heating section 121 has a plurality of lamps 121A, is arranged above the table 113, and irradiates the surface of the substrate W on the table 113 with light when each lamp 121A is turned on. This heating section 121 is configured to be moved vertically (ascent/descent direction) by a moving section 121B, and can move between an irradiation position close to the cup 112 (and close to the surface of the substrate W as indicated by solid line in FIG. 5) and a standby position spaced from the cup 112 by a predetermined distance (and spaced from the surface of the substrate W as indicated by alternate long and short dashed lines in FIG. 5). When the chemical solution or the cleaning liquid is supplied to the substrate W, the heating section 121 can be positioned in the standby position so that adhesion of the liquid used for the processing to the heating section 121 is prevented. When the substrate W is being set on the table 113 of the substrate processing chamber 110, the heating section 121 is positioned in the standby position so that the heating section 121 is prevented from impeding the entry of the substrate W. The heating section 121 may be lowered either after or before turning on the lamps. The heating section 121 has the substantially same specific structures as the heating section 64 arranged in the substrate drying chamber 60 of Embodiment 1.

In heating of the substrate W using the heating section 121, as illustrated in FIG. 8A, the heating by the heating section 121 causes liquid A1 of the volatile solvent in contact with a pattern P on the surface of the substrate W to start evaporation earlier than the liquid A1 of the volatile solvent on the other portion similarly to the heating by the heating section 64 of Embodiment 1. More specifically, in the liquid A1 of the volatile solvent supplied to the surface of the substrate W, only the portion in contact with the surface of the substrate W is rapidly heated to attain the gas phase. Thereby, gasification (boiling) of the liquid A1 of the volatile solvent forms a gas layer, namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

Procedures of cleaning and drying the substrate W by the substrate processing device 100 will now be described below.

(1) A transporting robot 11 supplies the substrate W from a substrate accommodation cassette 21 of a substrate supply/discharge section 20 to an in-dedicated buffer 31 of a substrate storing buffer section 30, and a transporting robot 12 takes out and sets the supplied substrate W on the table 113 of the substrate processing chamber 110 by holding it with support members 113A such as pins. In this state, similarly to the substrate processing device 10 of Embodiment 1, the controller 130 in the substrate processing chamber 110 controls the rotation section 114 to rotate the table 113 at a predetermined rotation speed, and then controls the chemical solution supply section 116 while positioning the solvent suction discharging section 115 in a standby position so that the chemical solution, i.e., APM is supplied from a nozzle 116A to the surface of the substrate W on the rotating table 113 for a predetermined time.

(2) Similarly to the substrate processing device 10 of Embodiment 1, after stopping the supply of the chemical solution, the controller 130 then controls the cleaning liquid supply section 117 to supply the cleaning liquid, i.e., ultra-pure water from a nozzle 117A to the surface of the substrate W on the rotating table 113 for a predetermined time.

(3) When the cleaning liquid supply section 117 ends the cleaning of the substrate W, the controller 130 then locates the solvent suction discharging section 115 in an operation position, and controls the solvent supply section 118 to supply the volatile solvent, i.e., IPA from a nozzle 118A to the surface of the substrate W on the rotating table 113 for a predetermined time, similarly to that in the substrate processing device 10 of Embodiment 1. Also, the solvent suction discharging section 115 absorbs the IPA dispersing from the rotating substrate W. Thereby, the ultrapure water on the surface of the substrate W on the table 113 is replaced with the IPA.

(4) Then, the controller 130 controls the gas supply section 119 to supply a gas, i.e., an inert gas such as nitrogen gas from the nozzle 119A to the surface of the substrate W on the rotating table 113 for a predetermined time.

(5) When the replacement with the IPA in the above (3) ends, the controller 130 controls the heating section 121, moves the heating section 121 kept in the standby position to the irradiation position, and turns on each lamp 121A of the heating section 121 to heat the substrate W on the rotating table 113 for a predetermined time.

In the above heat drying by the heating section 121, it is important to heat the substrate W to a high temperature of hundreds of degrees within several seconds for instantaneously evaporating the volatile solvent, i.e., IPA in contact with the pattern P of the substrate W. It is necessary to heat only the substrate W without heating the IPA. For this, it is desirable to use the lamp 121A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially shorter than 10 seconds and, for example, falls within a range from several tens of milliseconds to several seconds.

(6) The droplets of the IPA on the surface of the substrate W is produced by the heating operation of the heating section 121. In this state, a solvent suction port 115A is given a suction force capable of absorbing the droplets of the IPA present on the surface of the substrate W, as described above. Therefore, the droplets of the IPA produced are absorbed and removed through the solvent suction port 115A. Thereby, the drying ends. It should be noted that the substrate may not be rotated although the substrate was rotated when the substrate W was heated by the heating section 121. In the case in which the substrate is rotated, a part of the droplets produced on the surface of the substrate W reaches the solvent suction discharging section 115 by the centrifugal force caused by the rotation of the substrate W, and is absorbed and removed by the solvent suction discharging section 115. According to the embodiment, therefore, the table 113 and the rotation section 114 form a substrate rotation drying section which removes the droplets of the volatile solvent produced on the surface of the substrate by the heating operation of the heating section 121 by dispersing them by the rotation of the substrate W, and dries the surface of the substrate W. Also, the solvent suction discharging section 115 forms an absorbing and drying section that absorbs and removes the droplets of the volatile solvent formed on the surface of the substrate by the heating operation of the heating section 121, and dries the surface of the substrate.

(7) Then, the controller 130 stops the rotation of the table 113, and the transporting robot 12 takes out the substrate W already cleaned and dried on the stopped table 113 from the substrate processing chamber 110, and feeds the substrate W into an out-dedicated buffer 32 of the substrate storing buffer section 30. The transporting robot 11 takes out the substrate W from the out-dedicated buffer 32 of the substrate storing buffer section 30, and discharges it to the substrate accommodation cassette 21 of the substrate supply/discharge section 20.

Before taking out the substrate W in the above (7), the controller 130 turns off the lamps 121A of the heating section 121, and positions it in the standby position. Thereby, the heating section 121 does not impede the take-out operation of the substrate W.

Accordingly, the substrate processing device 100 of Embodiment 2 can achieve substantially the same operation and effect as the substrate processing device 10 of Embodiment 1. In this embodiment 2, the order of the processes (4) and (5) may be inverted.

Figure 6:
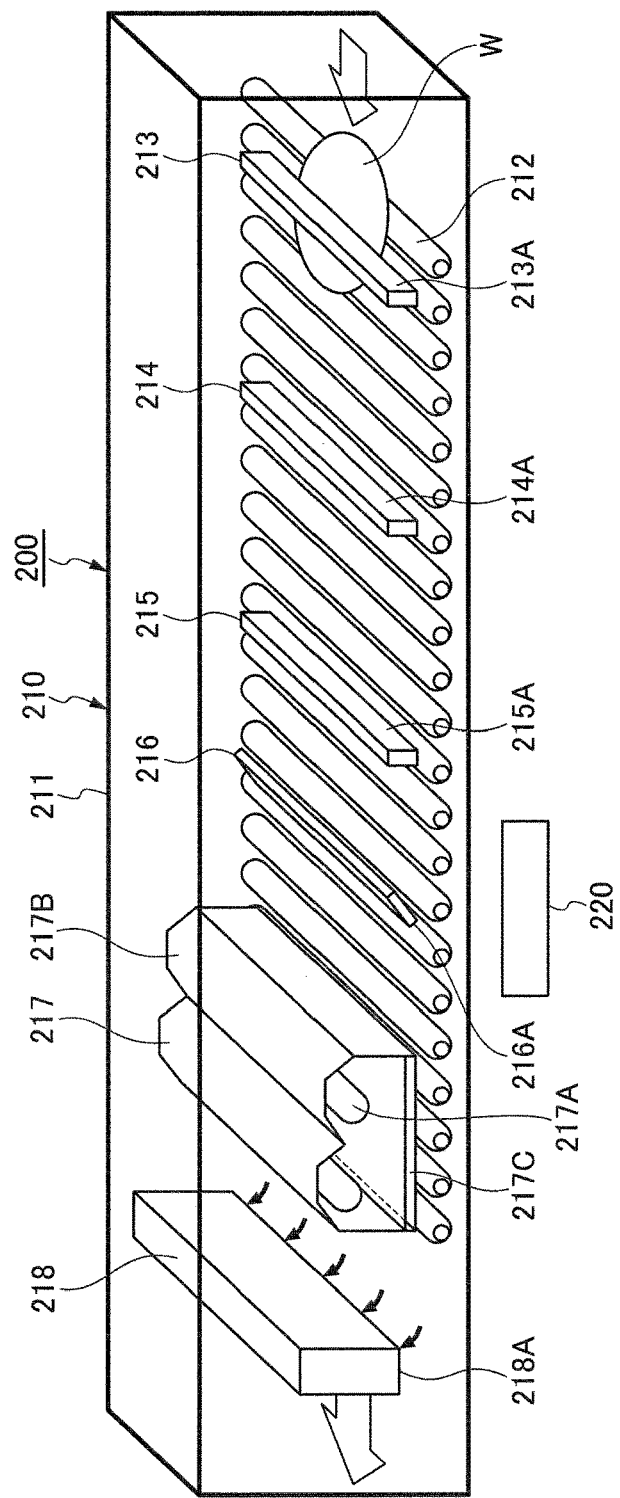
FIG. 6 is a schematic view illustrating a substrate processing device of an embodiment 3.
Figure 7:
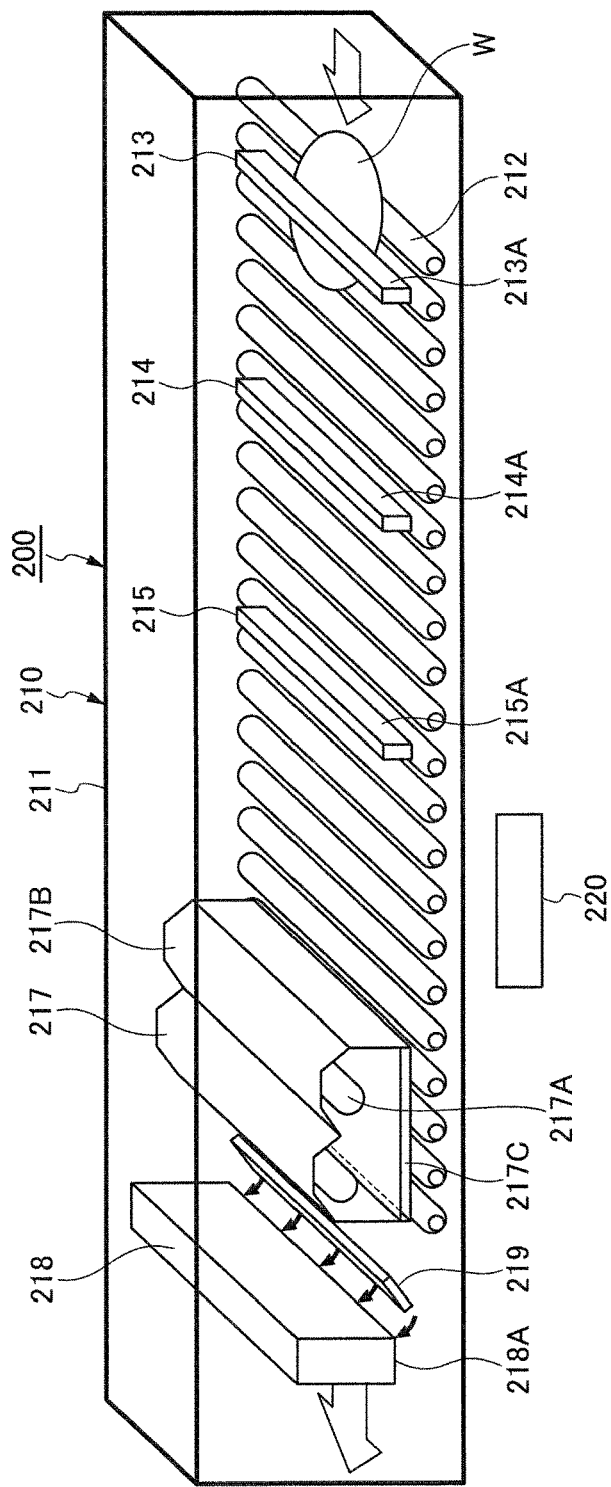
FIG. 7 is a schematic view illustrating a modification of a substrate processing device.

(Embodiment 3) (FIGS. 6 and 7)

A substrate processing device 200 of an embodiment 3 includes a tunnel-like processing box 211 forming a substrate processing chamber 210, and a plurality of transport rollers 212 forming a transporting section in the processing box 211 and transporting substrates W. Further, the substrate processing device 200 includes a chemical solution supply section 213 supplying a chemical solution to a surface of the substrate W on the transport rollers 212, a cleaning liquid supply section 214 supplying a cleaning liquid to the surface of the substrate W on the transport rollers 212, a solvent supply section 215 supplying a volatile solvent, a gas supply section 216 supplying a gas to the surface of the substrate W on the transport rollers 212, a heating section 217 heating the substrate W supplied with the volatile solvent, a suction drying section 218 for drying the surface of the substrate W heated by the heating section 217, and a controller 220 controlling the various portions.

The processing box 211 has a tunnel-like form. It receives the unprocessed substrate W through an upstream opening, and discharges the substrate W cleaned and dried in the substrate processing chamber 210 through a downstream opening of the processing box 211.

The transport rollers 212 are driven to rotate by a drive section such as a motor (not illustrated), and transport the substrate W fed through the upstream opening of the processing box 211 toward the downstream opening along a lower transport passage of the chemical solution supply section 213, cleaning liquid supply section 214, solvent supply section 215, gas supply section 216, heating section 217, and suction drying section 218. The transport rollers 212 are electrically connected to the controller 220, which controls the drive thereof. In FIGS. 6 and 7, the chemical solution supply section 213, cleaning liquid supply section 214 and solvent supply section 215 are arranged in the transporting direction of the substrate W and successively neighbor to each other. However, the arrangement pitches thereof are larger than a length of the transported substrate W in the transporting direction, and are appropriately set according to liquid supply rates of the respective supply section.

The chemical solution supply section 213 has a slit-like nozzle 213A discharging a chemical solution downward to the widthwise full area of the surface of the substrate W on the transport rollers 212, and supplies the chemical solution such as APM (Ammonia and hydrogen Peroxide water Mixture) for resist-peeling processing to the surface of the substrate W on the transport rollers 212 through the nozzle 213A. The chemical solution supply section 213 is electrically connected to the controller 220, which controls the drive thereof. The chemical solution supply section 213 includes a tank storing the chemical solution, a pump serving as a drive source, a valve serving as a regulator valve regulating a supply rate, and others, although not illustrated.

The cleaning liquid supply section 214 has a slit-like nozzle 214A discharging the cleaning liquid downward to the widthwise full area of the surface of the substrate W on the transport rollers 212, and supplies the cleaning liquid such as pure water (ultrapure water) for cleaning processing to the surface of the substrate W on the transport rollers 212 through the nozzle 214A. The cleaning liquid supply section 214 is electrically connected to the controller 220, which controls the drive thereof. The cleaning liquid supply section 214 includes a tank storing the cleaning liquid, a pump serving as a drive source, a valve serving as a regulator valve regulating a supply rate, and others, although not illustrated.

The solvent supply section 215 has a slit-like nozzle 215A discharging the volatile solvent downward to the widthwise full area of the surface of the substrate W on the transport rollers 212, and supplies the volatile solvent such as IPA to the surface of the substrate W on the transport rollers 212 through the nozzle 215A. The solvent supply section 215 supplies the volatile solvent to the surface of the substrate W already supplied with the cleaning liquid from the cleaning liquid supply section 214, and replaces the cleaning liquid on the surface of the substrate W with the volatile solvent. The solvent supply section 215 is electrically connected to the controller 220, which controls the drive thereof. The solvent supply section 215 includes a tank storing the volatile solvent, a pump serving as a drive source, a valve serving as a regulator valve regulating a supply rate, and others, although not illustrated.

The gas supply section 216 is located upstream, in the substrate transporting direction of the transport rollers 212, to the heating section 217, and is arranged above the transport rollers 212. The gas supply section 216 has a slit-like nozzle 216A obliquely discharging a gas to the widthwise full area of the surface of the substrate W on the transport rollers 212, and supplies through the nozzle 216A a gas, e.g., an inert gas such as nitrogen gas to the surface of the substrate W on the transport rollers 212 to form a nitrogen gas atmosphere in the space on the surface of the substrate W in the processing box 211. The nozzle 216A is attached to the processing box 211, and its angle, discharging flow velocity and others are adjusted to supply the gas to the widthwise full area of the surface of the substrate W. This gas supply section 216 is electrically connected to the controller 220, which controls the drive of the gas supply section 216. The gas supply section 216 includes a tank storing the gas, a valve serving as a regulator valve regulating a supply rate, and others, although not illustrated.

The heating section 217 has a plurality of lamps 217A, is arranged above the transport rollers 212, and each of the lamps 217A is turned on to irradiate the surface of the substrate W on the transport rollers 212 with light. The heating section 217 heats the substrate W by irradiating the widthwise full area of the surface of the substrate W with the light emitted through a transparent cover 217C from the lamps 217A arranged in a lamp casing 217B attached to the processing box 211. This heating section 217 is electrically connected to the controller 220, which controls the drive of the heating section 217.

In heating of the substrate W using the heating section 217, as illustrated in FIG. 8A, the heating by the heating section 217 causes liquid A1 of the volatile solvent in contact with a pattern P on the surface of the substrate W to start evaporation earlier than the liquid A1 of the volatile solvent on the other portion. Thereby, gasification (boiling) of the liquid A1 of the volatile solvent forms a gas layer, namely a gas layer A2 of the volatile solvent taking a thin-film-like form around the pattern P on the surface of the substrate W. Therefore, the liquid A1 of the volatile solvent between the neighboring patterns P is pushed onto the surface of the substrate W by the gas layer A2, and its own surface tension changes the liquid A1 into many droplets.

The suction drying section 218 is located downstream, in the substrate transporting direction of the transport rollers 212, from the heating section 217 and is arranged above the transport rollers 212. The suction drying section 218 is attached to the processing box 211 and has a solvent suction port 218A of a slit-like form opening toward the widthwise full area of the surface of the substrate W on the transport rollers 212. The suction drying section 218 applies a suction force provided to the solvent suction port 218A to the widthwise full area of the surface of the substrate W, and dries the surface of the substrate W by absorbing and removing the droplets of the volatile solvent produced on the surface of the substrate W by the heating operation of the heating section 217 as described above. This suction drying section 218 is electrically connected to the controller 220, which controls the drive of the suction drying section 218. A vacuum pump (not illustrated) for absorbing the droplets of the volatile solvent is connected to the solvent suction port 218A.

In the substrate processing chamber 210, a blow-off drying section may be used together with the suction drying section 218. This blow-off drying section blows and removes the droplets of the volatile solvent produced on the surface of the substrate W by an injection gas to dry the surface of the substrate W. The gas supply section 216 described above may also be used as this blow-off drying section.

FIG. 7 illustrates a modification of the substrate processing chamber 210. This modification is provided with a blow-off drying section 219 injecting an inert gas such as nitrogen gas to a downstream side of the heating section 217 in the substrate transporting direction of the transport rollers 212 when an atmosphere forming section (not illustrated) controls the space on the surface of the substrate W in the processing box 211 to keep a nitrogen gas atmosphere, and is configured to blow and remove the droplets of the volatile solvent produced on the surface of the substrate W by the blow-off drying section 219.

Procedures of cleaning and drying the substrate W by the substrate processing device 200 will now be described below.

(1) When the substrate W such as a liquid crystal substrate is transported onto the transport rollers 212 through the upstream opening of the processing box 211 in the substrate processing chamber 210, the controller 220 controls the chemical solution supply section 213 to supply the chemical solution, i.e., APM through the nozzle 213A to the widthwise full area of the surface of the substrate W on the transport rollers 212 for a predetermined time. Thereby, the surface of the substrate W on the transport rollers 212 is covered and processed by the APM.

(2) Then, after stopping the supply of the chemical solution, the controller 220 controls the cleaning liquid supply section 214 to supply the cleaning liquid, i.e., ultrapure water through the nozzle 214A to the widthwise full area of the surface of the substrate W on the transport rollers 212 for a predetermined time. Thereby, the surface of the substrate W on the transport rollers 212 is covered and cleaned by the ultrapure water.

(3) Then, the controller 220 controls the solvent supply section 215 to supply the volatile solvent, i.e., IPA from the nozzle 215A to the widthwise full area of the surface of the substrate W on the transport rollers 212 for a predetermined time. Thereby, the ultrapure water on the surface of the substrate W on the transport rollers 212 is replaced with the IPA.

(4) Then, the controller 220 controls the gas supply section 216 to supply a gas, i.e., nitrogen gas from the nozzle 216A to the surface of the substrate W on the transport rollers 212 for a predetermined time. The nozzle 216A ejects the nitrogen gas to the widthwise full area of the substrate W on the transport rollers 212. Thereby, the nitrogen atmosphere is formed in the space containing the substrate W on the transport rollers 212. By keeping the nitrogen atmosphere in this space, the oxygen concentration is reduced to suppress generation of watermarks on the surface of the substrate W.

(5) Then, the controller 220 controls the heating section 217 to turn on each lamp 217A of the heating section 217 to heat the substrate W on the transport rollers 212 for a predetermined time. At this time, the heating section 217 can perform the heating that can raise the temperature of the substrate W to 100 degrees or above in 10 seconds. This can instantaneously vaporize the liquid A1 of the volatile solvent in contact with the pattern P on the surface of the substrate W, and can immediately form the droplets of the liquid A1 of the volatile solvent on the other portion of the surface of the substrate W.

In the above heat drying by the heating section 217, it is important to heat the substrate W to a high temperature of hundreds of degrees within several seconds for instantaneously evaporating the volatile solvent, i.e., IPA in contact with the pattern P of the substrate W. It is necessary to heat only the substrate W without heating the IPA. For this, it is desirable to use the lamp 217A having a peak intensity in wavelengths of 500-3000 nm. For reliable drying, it is desirable that the final temperature of the substrate W attained by the heating is higher than the boiling points of the processing liquid and the solvent at an atmospheric pressure by 20° C. or more. Additionally, it is desirable that the time required for reaching the final temperature is substantially within 10 seconds and, for example, falls within a range from several tens of milliseconds to several seconds.

(6) Then, the controller 220 controls the suction drying section 218 to absorb and remove the droplets of the IPA which were produced on the surface of the substrate W by the heating operation of the heating section 217 on the transport rollers 212, and thereby dries the surface of the substrate W.

(7) Then, the substrate W that is already washed and dried on the transport rollers 212 is taken out through the downstream opening of the processing box 211 in the substrate processing chamber 210, and the substrate W is discharged for downstream processing.

The embodiment achieves the following operation and effect.

(a) The operation of heating the substrate W by the heating section 217 vaporizes the liquid of the volatile solvent, i.e., IPA used for replacement around the pattern P on the surface of the substrate W so that a gas layer of the vapored IPA forms a thin film around the pattern P on the surface of the substrate W. The liquid of IPA between the neighboring patterns P of the substrate W is pushed out by the gas layer, and is changed into a large number of droplets by its own surface tension. The droplets of the IPA formed on the surface of the substrate W in this manner are immediately absorbed and removed from the surface of the substrate W by the suction drying section 218 (which can be used with the gas supply section 216 serving as the blow-off drying section, and/or the blow-off drying section 219). Accordingly, the liquid of IPA can be dried instantaneously on the whole surface of the substrate W, and the drying speeds of various portions of the surface of the substrate W can be uniform so that remaining of the IPA between certain patterns P does not occur, and it is possible to suppress collapsing of the patterns P due to the surface tension of the liquid of the remaining IPA.

(b) The suction drying section 218 can reliably and easily absorb and remove the volatile solvent, i.e., IPA to a particular dedicated discharging destination. Accordingly, contact or the like of the volatile solvent with other chemical solution in a discharged place can be avoided, and unexpected firing and others of the volatile solvent can be prevented.

(c) By using the blow-off drying section (the gas supply section 216 or the blow-off drying section 219) in addition to the suction drying section 218 in the foregoing (a), the droplets of the volatile solvent produced on the surface of the substrate W can be removed by blowing off them. The liquid of the volatile solvent on the surface of the substrate W can be dried further instantaneously so that the drying speeds of the various portions of the substrate surface can be further uniformized to suppress more reliably the collapsing of the pattern P on the substrate surface. Without arranging the suction drying section 218, the blow-off drying section (the gas supply section 216 or the blow-off drying section 219) may be arranged to blow off, from the substrate, the droplets of the IPA produced by the heating of the substrate W by the heating section 217, and thereby to discharge the droplets of the IPA from the substrate for drying the substrate W. This is also true, for example, in Embodiment 1. That is; in FIGS. 3 and 4, without arranging the suction drying section 65, a blow-off drying section (the gas supply section 63 or the blow-off drying section 67) may be arranged to blow off, from the substrate, the droplets of the volatile solvent (IPA or the like) produced by the heating of the substrate W by the heating section 64, and thereby to discharge the droplets of the volatile solvent from the substrate for drying the substrate W. A discharge portion arranged below the processing boxes 61 or 211 may be configured to discharge externally the blown droplets of the IPA through the portion.

Although the invention has been described in detail with reference to the drawings, the specific structure of the invention is not restricted to these embodiments, and the invention contains changes and variations of design within a scope not departing from the essence of the invention.

For example, in Embodiment 1, the volatile solvent on the substrate may dry while the substrate W is being transported from the substrate cleaning chamber 40 to the substrate drying chamber 60. Therefore, a supply device of the volatile solvent may be arranged in an opening upstream to the processing box 61 in the substrate drying chamber 60 illustrated in FIGS. 3 and 4, the substrate W already supplied with the cleaning liquid in the substrate cleaning chamber 40 may be transported to the substrate drying chamber 60, and the volatile solvent may be supplied to the surface of the substrate W when the substrate W is fed into the substrate drying chamber 60.

In Embodiments 1 and 3, the transport roller 62 or 212 transports the substrate W. However, the substrate W may be transported while clamping the substrate W with a clamper instead of the roller.

For example, in Embodiment 3, the chemical solution, cleaning liquid, volatile solvent and the like are successively supplied to the substrate W while the substrate W is being transported. However, such a configuration may be employed that the transport rollers 212 or the like are used for transporting the substrate W, the transported substrate W is successively stopped at positions where a central portion, in the transporting direction, of the substrate is opposed to the nozzles 213A, 214A, and 215A, discharging the chemical solution, cleaning liquid and volatile solvent, respectively, and the respective nozzles supply the processing liquids such as the chemical solution to the stopped substrate W. Likewise, the heating of the substrate W by the heating section 217 may be performed while the substrate W is stopped.

As is done in Embodiment 1, the out-dedicated buffers 32 may be arranged in multiple stages, and the substrate drying chamber 60 may be arranged in each stage. In this structure, the drying processing can take place in parallel in the respective stages so that the substrate processing capacity can be increased. However, the out-dedicated buffer 32 may be arranged in one stage instead of the multiple stages, and the substrate drying chamber may be arranged in this stage.

The operation of supplying the inert gas such as nitrogen gas by each of the gas supply sections 63, 119, 216 is configured to start after the substrate W is positioned in the supply position, but the operation may start before the positioning.

For example, in Embodiment 2, the heating of the substrate W by the heating section 121 may be performed in a state where the pressure in the processing box 111 is reduced. This lowers the boiling point of the volatile solvent such as IPA in the processing box 111, and causes boiling at a temperature lower than that in the atmospheric pressure so that the heat damage to the substrate can be reduced.

In each embodiment, the supply of the volatile solvent such as IPA to the substrate W starts after the supply of the cleaning liquid to the substrate W stops. However, the supply of the volatile solvent may start while the supply of the cleaning liquid to the substrate W still continues in a final period of the cleaning with the cleaning liquid. In this case, in Embodiment 3, this can be carried out by setting the arrangement pitches between the cleaning liquid supply section 214 and the solvent supply section 215 to smaller pitches than a length of the transported substrate W in the transporting direction.

In each embodiment, a gas to be supplied can be a gas that is heated.

In each embodiment, it is desirable to supply an inert gas such as dried air or nitrogen gas into the processing boxes 41, 111, 211 before supplying the volatile solvent such as the IPA to the substrate W.

INDUSTRIAL APPLICABILITY

The invention can provide the substrate processing device and the substrate processing method that instantaneously dry the liquid on the surface during drying of the substrate.

EXPLANATIONS OF LETTERS OF NUMERALS

10, 100, 200 substrate processing device
47, 117, 214 cleaning liquid supply section
48, 118, 215 solvent supply section
64, 121, 217 heating section
65, 218 suction drying section
67, 219 blow-off drying section
113 table (substrate rotation drying section)
W substrate

What is claimed is:

1. A substrate processing device comprising:
   a processing chamber having a substrate inlet/outlet opening,
   a table provided in the processing chamber, and supporting a substrate horizontally,
   a rotation section rotating the table in a horizontal plane,
   a cleaning liquid supplying section having a cleaning liquid nozzle supplying a cleaning liquid to a patterned surface of the substrate which is rotated by the rotation section;
   a solvent supplying section having a solvent nozzle supplying a volatile solvent in a liquid state to the patterned surface of the substrate rotated by the rotation section and supplied with the cleaning liquid, to replace the cleaning liquid on the patterned surface of the substrate with the volatile solvent;
   a suction drying section;
   a heating section heating the substrate supplied with the volatile solvent,
   which includes a lamp, by which the patterned surface of the substrate can be heated and a gas layer of the volatile solvent can be formed thereon, and the gas layer can push the liquid volatile solvent so that it changes into droplets which can be sucked by the suction drying section; and
   a cup surrounds a periphery of the table so as to accommodate the table therein,
   wherein the suction drying section has a solvent suction discharging section including a solvent suction port which is located radially inward from the cup and has an annular opening surrounding the periphery of the table,
   the solvent suction port is movable between an operation position to suck the liquid droplets and a standby position,
   the suction drying section dries the surface of the substrate held by the table by removing the volatile solvent from the surface of the substrate according to sucking the liquid droplets of volatile solvent by the solvent suction port located at the operation position, in combination with a heating operation of the heating section, and
   both of the cleaning liquid nozzle and the solvent nozzle are provided in a side wall of the cup on the periphery of the cup, wherein the substrate inlet/outlet opening is provided in a side wall of the processing chamber, and wherein the cleaning liquid nozzle and the solvent nozzle are located in the side wall of the cup at a position opposite the location of the substrate inlet/outlet opening in the side wall of the processing chamber.

2. The substrate processing device according to claim 1, further comprising:
   a substrate rotation drying section drying the surface of the substrate by dispersing and removing the liquid droplets of the volatile solvent formed on the surface of the substrate by rotating the substrate.

3. The substrate processing device according to claim 1, wherein
   the volatile solvent is any one of IPA, univalent alcohols, ethers, or ethylene carbonate.

4. The substrate processing device according to claim 1, further comprising a moving section which moves the heating section vertically.

5. The substrate processing device according to claim 1, wherein
   the suction drying section, when the solvent suction port of the solvent suction discharging section is in the operation position, sucks the volatile solvent supplied from the solvent suppling section to the rotating substrate and dispersing from the substrate, as well as sucks the volatile solvent supplied from the solvent suppling section to the rotating substrate and formed into the liquid droplets produced by the heating section.

6. The substrate processing device according to claim 1, wherein
   the heating section heats the substrate rotated by the rotation section, and
   the suction drying section sucks the droplets of the volatile solvent formed on the patterned surface of the substrate rotated by the rotation section.

7. The substrate processing device according to claim 1, wherein
   the heating section heats the substrate which stops its rotation, and
   the suction drying section sucks the droplets of the volatile solvent formed on the patterned surface of the substrate by the heating of the heating section.

8. A substrate processing method comprising:
   supplying a cleaning liquid to a surface of a substrate;
   supplying a volatile solvent to the surface of the substrate supplied with the cleaning liquid to replace the cleaning liquid on the surface of the substrate with the volatile solvent;
   heating the substrate supplied with the volatile solvent; and
   drying the surface of the substrate by absorbing and removing liquid droplets of the volatile solvent formed on the surface of the substrate by heating of the substrate,
   wherein the substrate processing method is carried out with the substrate processing device according to claim 1.

9. The substrate processing method according to claim 8, further comprising:
   drying the surface of the substrate by blowing off and removing the liquid droplets of the volatile solvent formed on the surface of the substrate by the heating of the substrate.

10. The substrate processing method according to claim 8, further comprising:
    performing drying by dispersing and removing the liquid droplets of the volatile solvent formed by heating of the substrate on the surface of the substrate by rotating the substrate.

11. A substrate processing method comprising:
    supplying a cleaning liquid to a surface of a substrate;
    supplying a volatile solvent to the surface of the substrate supplied with the cleaning liquid to replace the cleaning liquid on the surface of the substrate with the volatile solvent;
    heating the substrate supplied with the volatile solvent; and
    drying the surface of the substrate by blowing off and removing liquid droplets of the volatile solvent formed on the surface of the substrate by heating of the substrate,
    wherein the substrate processing method is carried out with the substrate processing device according to claim 1.

12. The substrate processing method according to claim 11, further comprising:

performing drying by dispersing and removing the liquid droplets of the volatile solvent formed by heating of the substrate on the surface of the substrate by rotating the substrate.

* * * * *